United States Patent
Kao et al.

(10) Patent No.: US 9,335,634 B2
(45) Date of Patent: May 10, 2016

(54) DISPLAY MANUFACTURING METHOD AND PHOTO ALIGNMENT PROCESS

(71) Applicant: InnoLux Corporation, Miao-Li County (TW)

(72) Inventors: Ker-Yih Kao, Miao-Li County (TW); Tsan-Jen Chen, Miao-Li County (TW); Chien-Hsing Lee, Miao-Li County (TW)

(73) Assignee: Innolux Corporation, Jhu-Nan, Miao-Li County (TW)

( * ) Notice: Subject to any disclaimer, the term of this patent is extended or adjusted under 35 U.S.C. 154(b) by 217 days.

(21) Appl. No.: 14/099,263

(22) Filed: Dec. 6, 2013

(65) Prior Publication Data

US 2014/0160457 A1    Jun. 12, 2014

(30) Foreign Application Priority Data

Dec. 7, 2012    (TW) .............................. 101146135 A

(51) Int. Cl.
  *G03B 27/32*    (2006.01)
  *G03F 7/26*    (2006.01)

(52) U.S. Cl.
  CPC ........................................ *G03F 7/26* (2013.01)

(58) Field of Classification Search
  CPC ... G03F 7/26; G03F 7/70275; G03F 7/70291; G03F 7/70791
  USPC .......................................................... 355/77
  See application file for complete search history.

(56) References Cited

U.S. PATENT DOCUMENTS

2008/0187871 A1 * 8/2008 Fukui .................. G03F 7/70275
                                                      430/322

FOREIGN PATENT DOCUMENTS

| CN | 102004358 A | 4/2011 |
| CN | 102655073 A | 9/2012 |
| TW | 546700 B | 8/2003 |
| TW | 200848945 A1 | 12/2008 |
| TW | 201109802 A1 | 3/2011 |
| TW | 201217870 A1 | 5/2012 |
| TW | 201246264 A1 | 11/2012 |

* cited by examiner

*Primary Examiner* — Peter B Kim
(74) *Attorney, Agent, or Firm* — Muncy, Geissler, Olds & Lowe, P.C.

(57) ABSTRACT

A display manufacturing method comprises steps of: moving a first substrate and a second substrate by a conveying apparatus; and implementing a first exposure and a second exposure of the first substrate and a first exposure and a second exposure of the second substrate by at least one light emitting element when the conveying apparatus drives the first and second substrates to pass through the light source module. When the first exposures of the first and second substrates are implemented, the moving directions of the first and second substrates are opposite, or when the second exposures of the first and second substrates are implemented, the moving directions of the first and second substrates are opposite. A photo alignment process is also disclosed.

20 Claims, 4 Drawing Sheets

DISPLAY MANUFACTURING METHOD AND PHOTO ALIGNMENT PROCESS

CROSS REFERENCE TO RELATED APPLICATIONS

This Non-provisional application claims priority under 35 U.S.C. §119(a) on Patent Application No(s). 101146135 filed in Taiwan, Republic of China on Dec. 7, 2012, the entire contents of which are hereby incorporated by reference.

BACKGROUND

1. Technical Field

The invention relates to a display manufacturing method and a photo alignment process.

2. Related Art

With the progress of technologies, the flat display apparatus has been widely applied to various fields. Especially, the liquid crystal display (LCD) apparatus, with advantages of compactness, low power consumption and non-radiation, has gradually taken the place of cathode ray tube (CRT) display apparatuses and has been applied to various kinds of electronic products, such a mobile phone, a portable multi-media apparatus, a notebook computer, a TV, a screen, etc.

For achieving the purpose of wide viewing angle, the manufacturer of LCD apparatuses introduces the photo alignment process to control the orientation of liquid crystal molecules, and thereby the optical performance and yield of the LCD apparatus can be enhanced. In the photo alignment process, an ultraviolet source is used to illuminate a polymer thin film (alignment film) of a substrate so that the polymer structure of the thin film's surface can generate uneven photopolymerization, photoisomerization or photocleavage, which will induce the chemical structure of the thin film's surface into a specific orientation. Thereby, the liquid crystal molecules can be arranged for achieving the photo alignment. The photo alignment light source system (also called a polarization exposure optical system) used in the photo alignment process takes the largest part of the cost among the all apparatuses. However, in the conventional art, the exposure operation is implemented by an exposure apparatus (can have one or more ultraviolet lamps) in cooperation with only one substrate stage (carrying a glass substrate) as the photo alignment light source system. Therefore, the photo alignment process squanders the tact time on the non-exposure operation, such as exchanging the substrate, aligning the substrate or adjusting the exposure angle of the substrate, so that the exposure apparatus is not used effectively and sufficiently. Hence, for increasing the production capacity, it is required to add more photo alignment light source systems and installation room in the factory building, but thus the cost of the production line and products will be increased a lot, and therefore the competitiveness of the product will be decreased.

Therefore, it is an important subject to provide a display manufacturing method and a photo alignment process wherein the display manufacturing method can be used effectively for decreasing the tact time of the photo alignment process, and thereby the equipment cost can be decreased and the product's competitiveness can be increased.

SUMMARY

In view of the foregoing subject, an objective of this invention is to provide a display manufacturing method and a photo alignment process wherein the display manufacturing method can be used effectively for decreasing the tact time of the photo alignment process, and thereby the equipment cost can be decreased and the product's competitiveness can be increased.

To achieve the above objective, a display manufacturing method according to the invention comprises steps of: moving a first substrate and a second substrate by a conveying apparatus; and implementing a first exposure and a second exposure of the first substrate by at least one light emitting element and a first exposure and a second exposure of the second substrate by the least one light emitting element when the conveying apparatus drives the first and second substrates to pass through the light source module. When the first exposures of the first and second substrates are implemented, the moving directions of the first and second substrates are opposite, or when the second exposures of the first and second substrates are implemented, the moving directions of the first and second substrates are opposite.

In one embodiment, the light emitting element emits a polarized light.

In one embodiment, when the second exposure of the first substrate and the first exposure of the second substrate are implemented, the first and second substrates move in the same direction.

In one embodiment, when the first exposure and the second exposure are implemented, the first substrate and the second substrate move together or individually.

In one embodiment, when the first exposure of the first substrate is implemented, the second substrate is given work of the substrate exchange, substrate alignment and exposure angle adjustment, and when the second exposure of the second substrate is implemented, the first substrate is given work of the substrate exchange, substrate alignment and exposure angle adjustment.

In one embodiment, the conveying apparatus is of a linear type, and drives the first and second substrates to move linearly.

In one embodiment, at least one moving platform is disposed on conveying apparatus.

In one embodiment, the moving platform is a mechanical platform or an air floating stage.

In one embodiment, the moving platform includes a first moving platform and a second moving platform respectively carrying the first substrate and the second substrate, and the conveying apparatus drives the first and second moving platforms to move for moving the first and second substrates, respectively.

In one embodiment, the conveying apparatus includes a linear motor and a guiding track, or an air floating moving apparatus.

In one embodiment, a first substrate loading apparatus and a second substrate loading apparatus are disposed at two ends of the conveying apparatus, and load and unload the first substrate and the second substrate, respectively.

To achieve the above objective, a photo alignment process according to this invention comprises steps of: driving a first substrate to move along a first direction by the conveying apparatus and the first substrate experiencing the first exposure; driving the first substrate and a second substrate to move along a second direction by the conveying apparatus and the first substrate experiencing the second exposure and the second substrate experiencing the first exposure; and driving the second substrate to move along the first direction by the conveying apparatus and the second substrate experiencing the second exposure.

In one embodiment, the first direction and the second direction are opposite to each other.

In one embodiment, the photo alignment process further comprises steps of: loading and unloading the first substrate at one end of the conveying apparatus by a first substrate loading apparatus; and loading and unloading the second substrate at the other end of the conveying apparatus by a second substrate loading apparatus.

In one embodiment, when the first exposure of the first substrate is implemented, the second substrate is exchanged, and when the second exposure of the second substrate is implemented, the first substrate is exchanged.

In one embodiment, the photo alignment process further comprises a step of: giving the first substrate or the second substrate the substrate alignment and the exposure angle adjustment.

In one embodiment, when the first exposure of the first substrate is implemented, the second substrate is given the substrate alignment and the exposure angle adjustment.

In one embodiment, when the second exposure of the second substrate is implemented, the first substrate is given the substrate alignment and the exposure angle adjustment.

As mentioned above, in the display manufacturing method with system and the photo alignment-process of the invention, the conveying apparatus can move the first and second substrates, and when the first exposures of the first and second substrates are implemented by the light source module, the moving directions of the first and second substrates are opposite, or when the second exposures of the first and second substrates are implemented by the light source module, the moving directions of the first and second substrates are opposite. Thereby, the light source module of the display manufacturing system can be used effectively for decreasing the tact time of the photo alignment process, and thus the equipment cost can be decreased and the product's competitiveness can be increased.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION

The present invention will be apparent from the following detailed description, which proceeds with reference to the accompanying drawings, wherein the same references relate to the same elements.

The display manufacturing system according to this invention can be applied to the photo alignment process of an in-plane switch (IPS) LCD apparatus, a fringe field switching (FFS) LCD apparatus, a vertical alignment mode (VA mode) LCD apparatus or a 3D LCD apparatus.

FIGS. 1A to 1F are schematic diagrams of a display manufacturing method with system 1 according to an embodiment of this invention.

In this embodiment, the display manufacturing system 1 implements a photo alignment process to a first substrate S1 and a second substrate S2. However, this invention is not limited thereto. The display manufacturing system 1 also can implement the photo alignment process to more substrates by exchanging the substrate through a substrate exchanging apparatus.

Figure 1A:
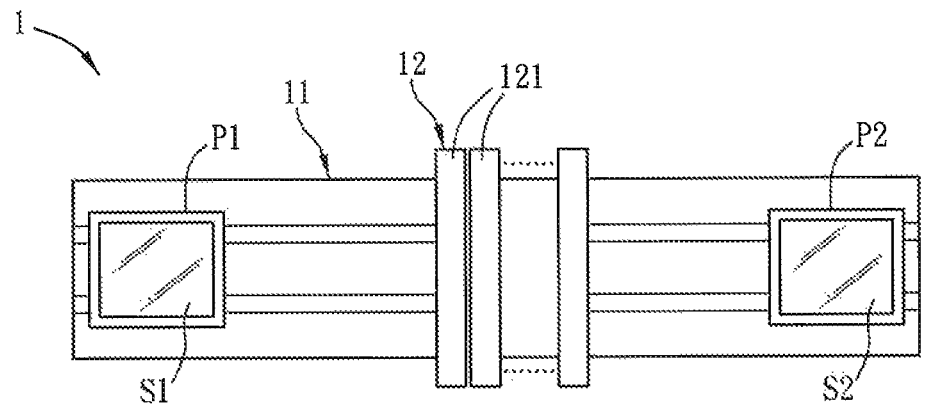
FIGS. 1A to 1F are schematic diagrams of a display manufacturing method with system according to an embodiment of this invention.

As shown in FIG. 1A, the display manufacturing system 1 includes a conveying apparatus 11 and a light source module 12. The conveying apparatus 11 can include a linear motor and a guiding track, or include an air floating substrate moving apparatus, for example. Herein, the conveying apparatus 11 is a mechanical conveying apparatus 11, including a linear motor and a linear guiding track (not shown) for example. The display manufacturing system 1 can further include at least a moving platform disposed on the conveying apparatus 11. The moving platform can be a mechanical platform or an air floating stage that moves the substrate by blowing. As shown in FIG. 1A, the display manufacturing system 1 herein has two moving platforms (a first moving platform P1 and a second moving platform P2) and they are mechanical moving platforms, for example. The first and second moving platforms P1 and P2 are disposed on the conveying apparatus 11, and can respectively carry the first and second substrates S1 and S2. Besides, the conveying apparatus 11 can drive the first and second moving platforms P1 and P2 to move for moving the first and second substrates S1 and S2. In this embodiment, the conveying apparatus 11 is of a linear type and can drive the first moving platform P1, the first substrate S1, the second moving platform P2 and the second substrate S2 to move. The conveying apparatus 11 can move the first substrate S1 and the second substrate S2 together or individually.

The light source module 12 has at least a light emitting element 121. Herein for example, the light source module 12 has a plurality of light emitting elements 121 (the number of which can be determined according to the actual requirements). The light emitting element 121 can be a lamp, and the lamp can emit a polarized light. The polarized light can make the molecular structure of the alignment film (with polyimide as material for example) of the first substrate S1 or second substrate S2 uneven photopolymerization, photoisomerization or photocleavage, which will induce the chemical structure of the surface of the alignment film into a specific orientation. Thereby, the liquid crystal molecules are arranged for achieving the purpose of photo alignment. The light source module 12 can further include a plurality of polarizing plates (not shown), and the light can become a parallel light after passing through the polarizing plates to evenly illuminate the first substrate S1 or the second substrate S2. When the conveying apparatus 11 drives the first substrate S1 and the second substrate S2 respectively pass through the light source module 12, the first substrate S1 is given a first exposure process and a second exposure process by the polarized light emitted by the light emitting element 121, and also the second substrate S2 is given a first exposure process and a second exposure process by the polarized light emitted by the light emitting element 121. In other words, the first substrate S1 or second substrate S2 of this embodiment needs to experience two exposure processes for completing the photo alignment process. Herein, the above-mentioned exposure process means that the alignment film of the first substrate S1 or second substrate S2 is illuminated by the light of the light emitting elements 121 when passing through the light source module 12.

Furthermore, the display manufacturing system 1 can further include a first substrate loading apparatus and a second substrate loading apparatus (not shown). They can have a manipulator each for example, and are respectively disposed at two ends of the conveying apparatus 11 for loading and unloading the first and second substrates S1 and S2. In other words, the first substrate loading apparatus can load and unload the first substrate S1, and the second substrate loading apparatus can load and unload the second substrate S2. Herein for example, the loading operation means that the manipulator clips a substrate that has not experienced the photo alignment process to put it on the moving platform, and the unloading operation means that the manipulator clips a substrate that has experienced the photo alignment process to remove it from the moving platform. Besides, some preparatory work for the exposure such as aligning the first substrate S1 or the second substrate S2 or adjusting their exposure angles can be done after loading the first substrate S1 or second substrate S2.

Figure 1B:
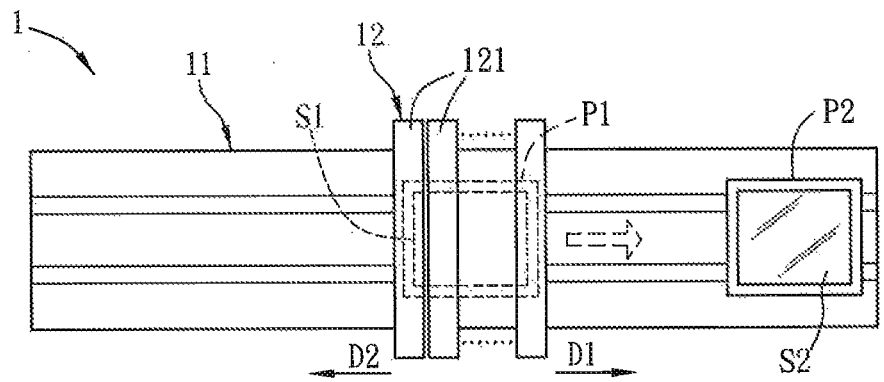
Figure 1C:
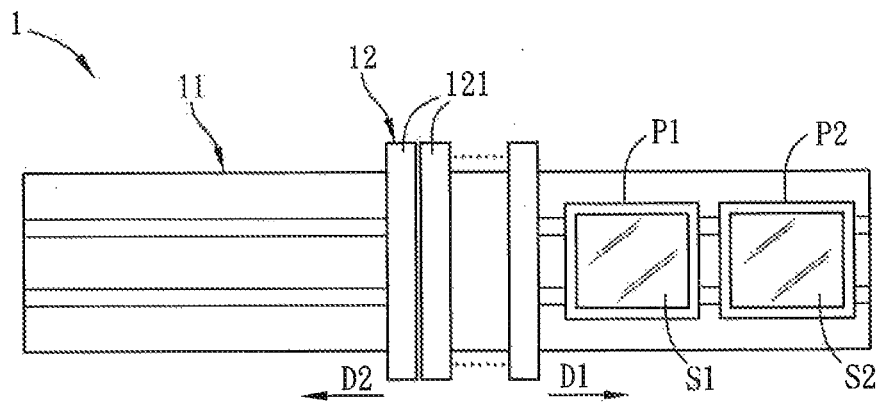
Figure 1D:
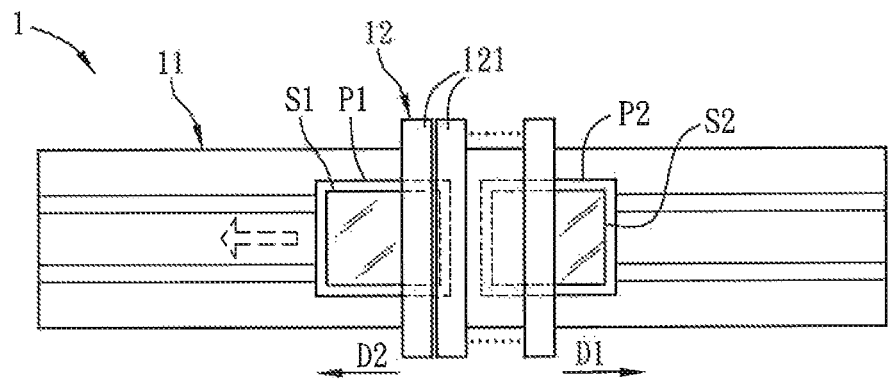
Figure 1E:
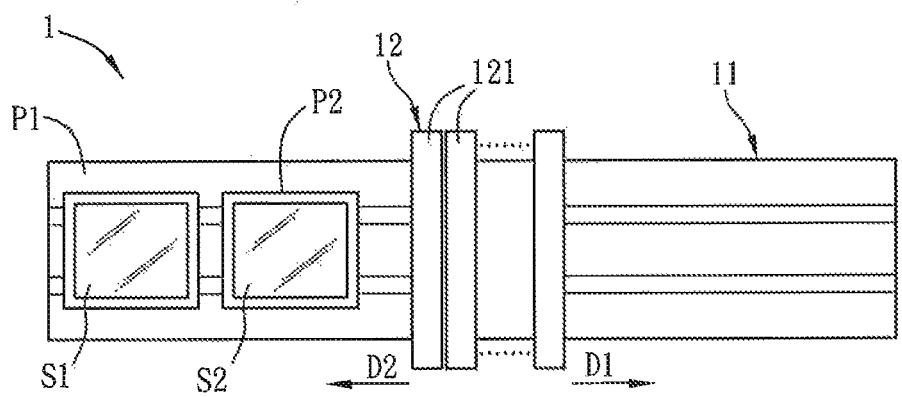
Figure 1F:
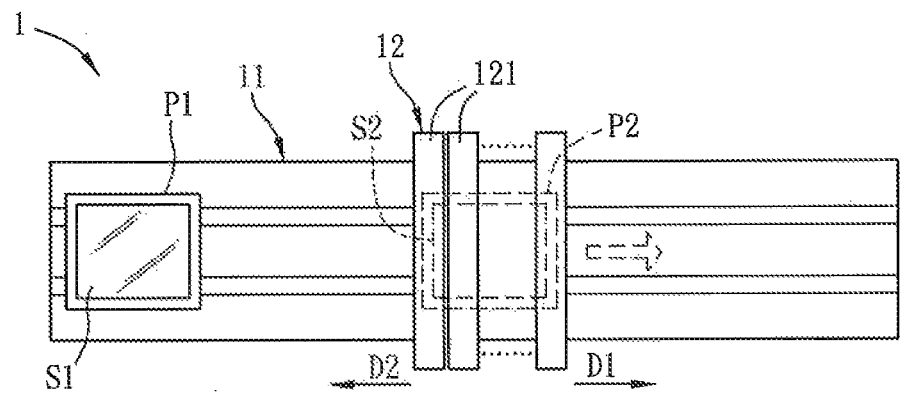
Figure 2:
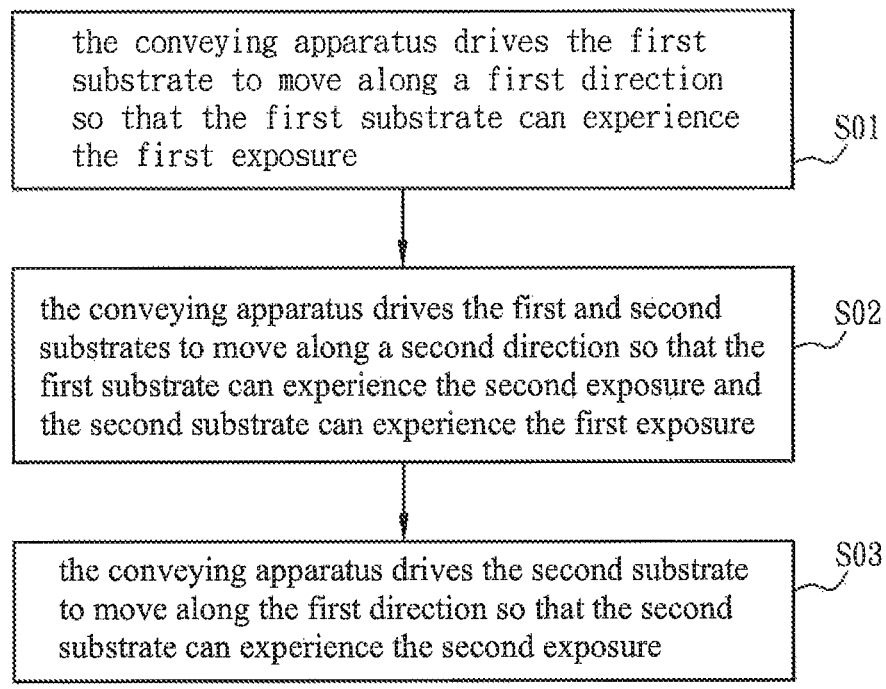
FIG. 2 is a flow chart of a photo alignment process according to an embodiment of this invention.

FIG. 2 is a flow chart of a photo alignment process according to an embodiment of this invention. The procedure of the photo alignment process according to the invention will be further illustrated by referring to FIGS. 1A to 1F and FIG. 2.

The photo alignment process can include the steps S01 to S03.

Before the step S01, as shown in FIG. 1A, the first substrate S1 needs to be loaded by the first substrate loading apparatus located at one end of the conveying apparatus 11 and the second substrate S2 needs to be loaded by the second substrate loading apparatus located at the other end of the conveying apparatus 11, so that the first and second substrates S1 and S2 are put on the first and second moving platforms P1 and P2, respectively. If it is required for the process, some preparatory work for the exposure such as aligning the first substrate S1 or the second substrate S2 or adjusting the exposure angle can be done after loading the first substrate S1 and the second substrate S2.

Then, the step S01 is implemented. As shown in FIG. 1B, the conveying apparatus 11 drives the first substrate S1 to move along a first direction D1 so that the first substrate S1 can experience the first exposure. In the meantime, the first substrate S1 moves alone while the second substrate S2 doesn't move. As shown in FIG. 1C, the first substrate S1 linearly moves to the side of the second substrate S2, so that the first substrate S1 and the second substrate S2 are both disposed on the same side (the right side in FIG. 1C) of the conveying apparatus 11.

Then, the step S02 is implemented. As shown in FIG. 1D, the conveying apparatus 11 drives the first and second substrates S1 and S2 to move along a second direction D2 so that the first substrate S1 can experience the second exposure while the second substrate S2 can experience the first exposure. In other words, when the second exposure of the first substrate S1 and the first exposure of the second substrate S2 are implemented, the first and second substrates S1 and S2 both move along the second direction D2. The first direction D1 and the second direction D2 are opposite directions. As shown in FIG. 1E, the first and second substrates S1 and S2 both move to the other side (the left side in FIG. 1E) of the conveying apparatus 11. In this embodiment, the first direction D1 is rightward and the second direction D2 is leftward, and in other embodiments they can be changed.

Then, the step S03 is implemented. As shown in FIG. 1F, the conveying apparatus 11 drives the second substrate S2 to move along the first direction D1 so that the second substrate S2 can experience the second exposure. Herein, because the first substrate S1 has experienced the second exposure at the step S02, the second substrate S2 moves alone when the second exposure of the second substrate S2 in the step S03 is implemented. In the meantime, the first substrate S1 can be unloaded, and another first substrate S1 can be loaded to the first moving platform P1. Besides, some preparatory work for the exposure such as aligning the new first substrate S1 or adjusting the exposure angle can be done. Then, after completing the second exposure of the second substrate S2, the second substrate S2 is located on the right side of the conveying apparatus 11 as shown in FIG. 1A.

By the step S03, the second exposure of the second substrate S2 is completed while the preparatory work of the new first substrate S1 for the exposure is also completed. Therefore, the procedures in FIGS. 1B to 1F can be repeated, so that the new first substrate S1 moves along the first direction D1 for experiencing the first exposure. Besides, because the second exposure of the second substrate S2 has been completed when the first exposure of the new first substrate S1 is implemented, the second substrate S2 can be replaced by a new second substrate, and the preparatory work such as aligning the new second substrate S2 or adjusting the exposure angle of the new second substrate S2 can be done.

Accordingly, in the display manufacturing system 1 and the photo alignment process of the invention, the first substrate S1 moves along the first direction D1 for the first exposure as shown in FIG. 1B, the second substrate S2 moves along the second direction D2 for the first exposure as shown in FIG. 1D. So, for the first exposure, the first substrate S1 and the second substrate S2 move along opposite directions.

Furthermore, the first substrate S1 moves along the second direction D2 for the second exposure as shown in FIG. 1D, the second substrate S2 moves along the first direction D1 for the second exposure as shown in FIG. 1F. So, for the second exposure, the first substrate S1 and the second substrate S2 move along opposite directions.

Besides, as shown in FIGS. 1B and 1F, when the first exposure of the first substrate S1 and the second exposure of the second substrate S2 are implemented, the first and second substrates S1 an S2 individually move along the first direction D1. As shown in FIG. 1D, when the second exposure of the first substrate S1 and the first exposure of the second substrate S2 are implemented, the first and second substrates S1 and S2 move along the second direction D2 together.

Accordingly, in the display manufacturing system 1 and the photo alignment process of the invention, the conveying apparatus 1 can the first and second substrates S1 and S2, and when the first exposures of the first and second substrates S1 and S2 are implemented by the light source module 12, the moving directions of the first and second substrates S1 and S2 are opposite, or when the second exposures of the first and second substrates S1 and S2 are implemented by the light source module 12, the moving directions of the first and second substrates S1 and S2 are opposite. Thereby, the light source module 12 of the display manufacturing system 1 can be used effectively for decreasing the tact time of the photo alignment process, and thus the equipment cost can be decreased and the product's competitiveness can be increased.

Figure 3:
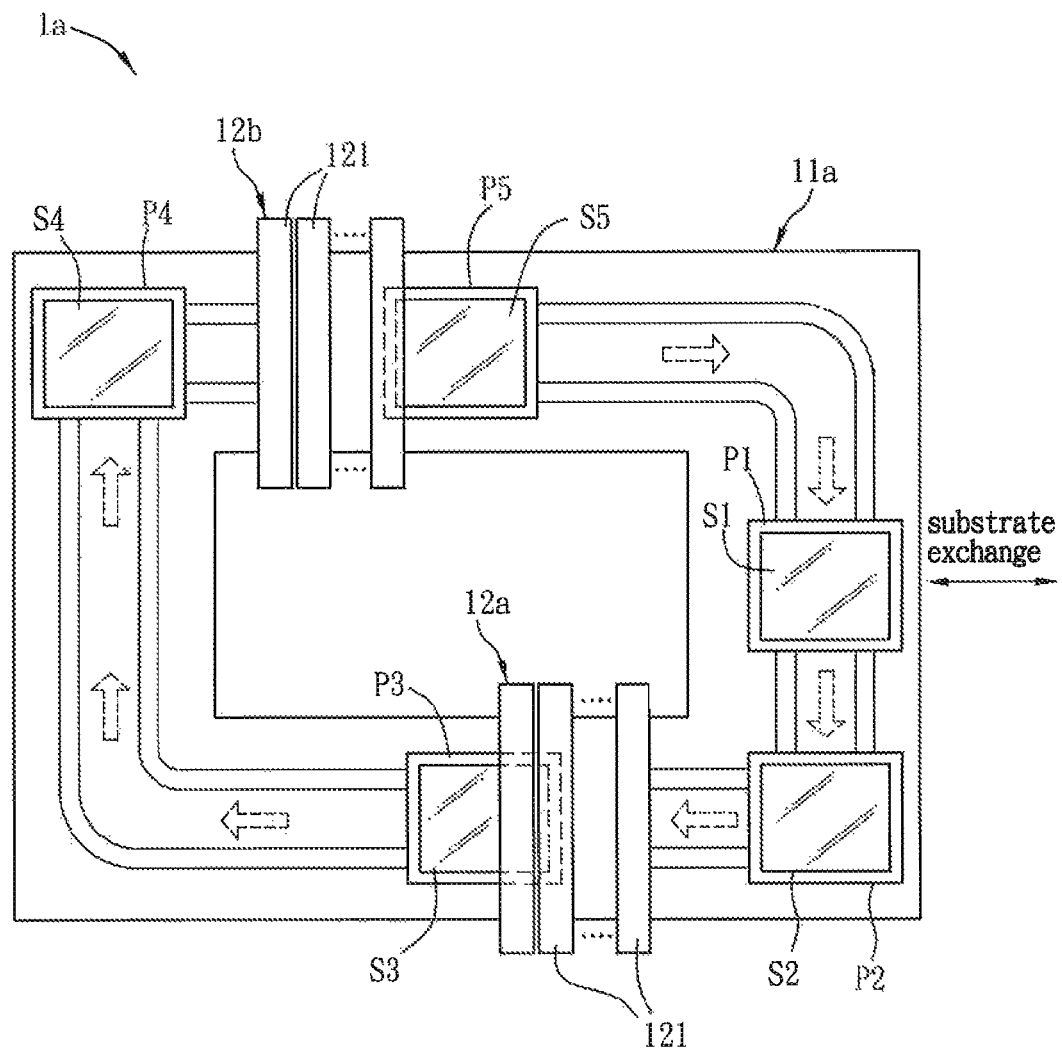
FIG. 3 is a schematic diagram of a display manufacturing method with system according to another embodiment of this invention.

FIG. 3 is a schematic diagram of a display manufacturing system 1a according to another embodiment of this invention.

In comparison with the display manufacturing system 1, the display manufacturing system 1a of this embodiment has an annular conveying apparatus 11a, and has the first moving platform P1 to the fifth moving platform P5 respectively carrying the first substrate S1 to the fifth substrate S5. In other embodiments, more than or less than 5 moving platforms or substrates can be configured according to the actual requirements. In this embodiment, the conveying apparatus 11a can drive the platforms P1 to P5 to move for moving the substrates S1 to S5 passing through the light source modules 12a and 12b. The moving direction is clockwise in this embodiment for example, and can be counterclockwise in other embodiments.

As shown in FIG. 3, when a substrate passes through the light source module 12a, the substrate can be illuminated by the light emitted by the light emitting elements 121 of the light source module 12a for the first exposure. When the substrate passes through the light source module 12b, the substrate can be illuminated by the light emitted by the light emitting elements 121 of the light source module 12b for the second exposure. Thereby, the photo alignment process of the substrate is completed.

For the first substrate S1 as an example, after being loaded (by the substrate exchange), the first substrate S1 can be given some preparatory work such as the substrate alignment and exposure angle adjustment and then can pass through the light source modules 12a and 12b clockwise for the two exposures. When the first substrate S1 moves to the place of the second substrate S2 in FIG. 3, the second substrate S2 also mows to the light source module 12a, and the rest can be deduced by analogy, so that the fifth substrate S5 moves to the original place of the first substrate S1. At this time, because the whole photo alignment process (two exposures) of the fifth substrate S5 has been completed, the fifth substrate S5 can be replaced by a new substrate at the original place of the first substrate S1. In other words, when the first substrate S1 in FIG. 3 moves to the next place, the fifth substrate S5 moves to the original place of the first substrate S1 for the substrate exchange.

In summary, in the display manufacturing method with system and the photo alignment process of the invention, the conveying apparatus can move the first and second substrates, and when the first exposures of the first and second substrates are implemented by the light source module, the moving directions of the first and second substrates are opposite, or when the second exposures of the first and second substrates are implemented by the light source module, the moving directions of the first and second substrates are opposite. Thereby, the light source module of the display manufacturing system can be used effectively for decreasing the tact time of the photo alignment process, and thus the equipment cost can be decreased and the product's competitiveness can be increased.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A display manufacturing method, comprising:
   moving a first substrate and a second substrate by a conveying apparatus; and
   implementing a first exposure and a second exposure of the first substrate by at least one light emitting element and a first exposure and a second exposure of the second substrate by the at least one light emitting element when the conveying apparatus drives the first and second substrates to pass through the at least one light emitting element,
   wherein when the first exposures of the first and second substrates are implemented, the moving directions of the first and second substrates are opposite, or when the second exposures of the first and second substrates are implemented, the moving directions of the first and second substrates are opposite.

2. The display manufacturing method as recited in claim 1, wherein the at least one light emitting element emits a polarized light.

3. The display manufacturing method as recited in claim 1, wherein when the second exposure of the first substrate and the first exposure of the second substrate are implemented, the first and second substrates move in the same direction.

4. The display manufacturing method as recited in claim 1, wherein when the first exposure and the second exposure are implemented, the first substrate and the second substrate move together or individually.

5. The display manufacturing method as recited in claim 1, wherein when the first exposure of the first substrate is implemented, the second substrate is given a substrate exchange, a substrate alignment and an exposure angle adjustment, and when the second exposure of the second substrate is implemented, the first substrate is given a substrate exchange, a substrate alignment and an exposure angle adjustment.

6. The display manufacturing method as recited in claim 1, wherein the conveying apparatus is of a linear type, and drives the first and second substrates to move linearly.

7. The display manufacturing method as recited in claim 1, wherein at least one moving platform is disposed on the conveying apparatus.

8. The display manufacturing method as recited in claim 7, wherein the at least one moving platform is a mechanical platform or an air floating stage.

9. The display manufacturing method as recited in claim 7, wherein the at least one moving platform includes a first moving platform and a second moving platform respectively carrying the first substrate and the second substrate, and the conveying apparatus drives the first and second moving platforms to move for moving the first and second substrates, respectively.

10. The display manufacturing method as recited in claim 1, wherein the conveying apparatus includes a linear motor and a guiding track, or an air floating moving apparatus.

11. The display manufacturing method as recited in claim 1, wherein a first substrate loading apparatus and a second substrate loading apparatus are disposed at two ends of the conveying apparatus, and load and unload the first substrate and the second substrate, respectively.

12. A photo alignment process, comprising steps of:
   driving a first substrate to move along a first direction by a conveying apparatus and the first substrate experiencing a first exposure;
   driving the first substrate and a second substrate to move along a second direction by the conveying apparatus and the first substrate experiencing a second exposure and the second substrate experiencing a first exposure; and
   driving the second substrate to move along the first direction by the conveying apparatus and the second substrate experiencing a second exposure.

13. The photo alignment process as recited in claim 12, wherein the first direction and the second direction are opposite to each other.

14. The photo alignment process as recited in claim 12, wherein when the first exposure and the second exposure are implemented, the first substrate and the second substrate move together or individually.

15. The photo alignment process as recited in claim 12, further comprising steps of:
   loading and unloading the first substrate at one end of the conveying apparatus by a first substrate loading apparatus; and
   loading and unloading the second substrate at the other end of the conveying apparatus by a second substrate loading apparatus.

16. The photo alignment process as recited in claim 15, wherein when the first exposure of the first substrate is implemented, the second substrate is exchanged, and when the second exposure of the second substrate is implemented, the first substrate is exchanged.

17. The photo alignment process as recited in claim 12, further comprising a step of:
   giving the first substrate or the second substrate a substrate alignment and an exposure angle adjustment.

18. The photo alignment process as recited in claim 17, wherein when the first exposure of the first substrate is implemented, the second substrate is given the substrate alignment and the exposure angle adjustment.

19. The photo alignment process as recited in claim 17, wherein when the second exposure of the second substrate is implemented, the first substrate is given the substrate alignment and the exposure angle adjustment.

20. The photo alignment process as recited in claim 12, wherein the conveying apparatus includes a linear motor and a guiding track, or an air floating moving apparatus.

\* \* \* \* \*